United States Patent [19]

Ikeya et al.

[11] Patent Number: 5,727,922
[45] Date of Patent: Mar. 17, 1998

[54] ELECTRONIC COMPONENT TRANSFER APPARATUS AND METHOD

[75] Inventors: Keishi Ikeya, Kofu; Kanji Uchida, Yamanashi-ken; Makoto Sueki; Hideki Uchida, both of Kofu, all of Japan

[73] Assignee: Matsushita Electric Industrial Co., Ltd., Osaka-fu, Japan

[21] Appl. No.: 521,050

[22] Filed: Aug. 29, 1995

[30] Foreign Application Priority Data

Aug. 30, 1994 [JP] Japan .................................. 6-204074

[51] Int. Cl.⁶ .................................................. B65G 69/00
[52] U.S. Cl. ........................ 414/752; 414/757; 414/781; 414/786; 294/64.1
[58] Field of Search ........................... 414/752, 781, 414/757, 786; 294/64.1, 2; 269/73, 21

[56] References Cited

FOREIGN PATENT DOCUMENTS

| 7-79095 | 3/1995 | Japan . | |
| 1504093 | 8/1989 | U.S.S.R. | 294/2 |

Primary Examiner—Donald W. Underwood
Attorney, Agent, or Firm—Wenderoth, Lind & Ponack

[57] ABSTRACT

In an electronic component transfer method and apparatus, an electronic component is placed on a suctional top surface of a suction nozzle brought into a protruded posture relative to a component fixing block while the electronic component is drawn by suction by a transfer nozzle which is movable up and down, the electronic component placed on the component fixing block is pressed from above with the transfer nozzle so that the electronic component is sandwiched between the transfer nozzle and the suction nozzle, a position of the suction nozzle is fixed by the suction nozzle fixing stopper, and, in this state, the electronic component is held on the component fixing block by the holding members.

6 Claims, 5 Drawing Sheets

ELECTRONIC COMPONENT TRANSFER APPARATUS AND METHOD

BACKGROUND OF THE INVENTION

The present invention relates to an electronic component transfer apparatus and method to be used in the process of transferring components from a component feed section to a mounting head in an electronic component mounting machine or the like.

Figure 4A:
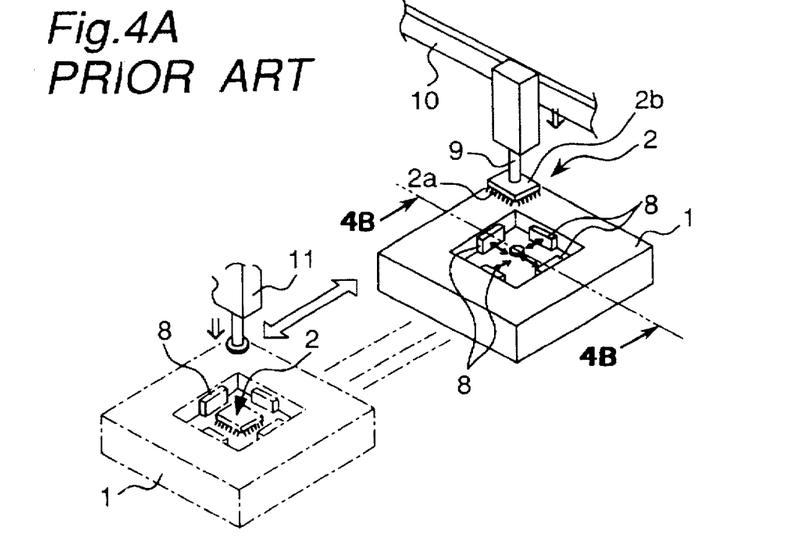
FIG. 4A is a sectional view of a conventional electronic component transfer apparatus.
Figure 4B:
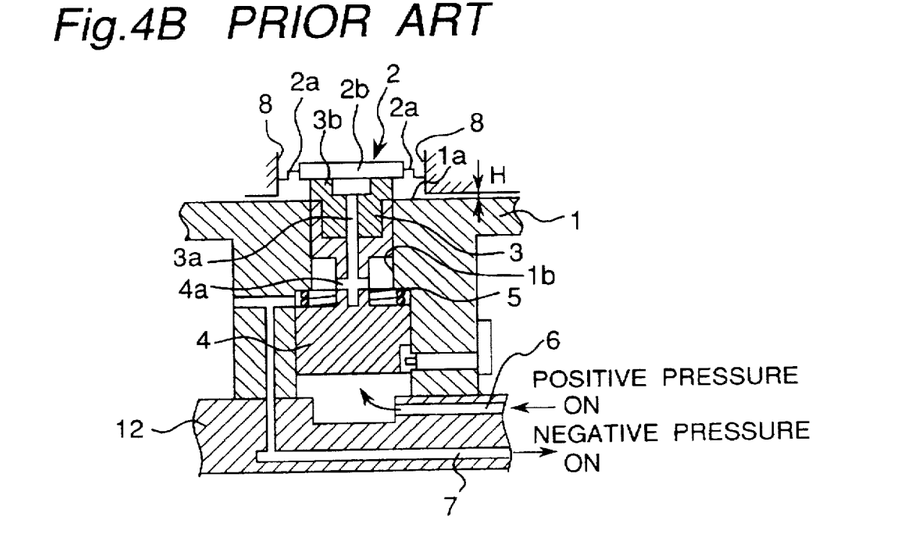
FIG. 4B is a sectional view of the conventional electronic component transfer apparatus.

A conventional electronic component transfer apparatus is shown in FIGS. 4A and 4B. In FIGS. 4A and 4B, reference numeral 1 denotes a component fixing block for fixing an electronic component 2 to a specified position. In a hole 1b provided at an inside center of the component fixing block 1, a suction nozzle 3 and a vacuum rod 4 are held so as to be movable up and down while they are kept in sliding contact with the component fixing block 1, as shown in FIG. 4B, where the vacuum rod 4 fitted to a lower portion of the component fixing block 1 is biased downward by a spring 5. A lower block 12 disposed below the component fixing block 1 is so arranged that a positive pressure can be applied to the lower surface side of the vacuum rod 4 through a hole 6 formed in the lower block 12, and that a negative pressure will act on a suction passage 3a of the suction nozzle 3 through both a hole 7 formed in lower portions of the lower block 12 and the component fixing block 1, and a passage 4a of the vacuum rod 4. Reference numeral 8 denotes holding members that can be freely advanced toward and retracted from near the center of the component fixing block 1 (toward and from near the suction nozzle 3), and that are adjustable in height H relative to the component fixing block 1. Further, reference numeral 9 denotes a transfer nozzle for transferring the electronic component 2 from the component feed section side (not shown), where the electronic component 2 is transferred by a component transfer shaft 10. Numeral 11 denotes a mounting head for transferring the electronic component 2 to the mounting place.

A positive pressure, when applied to the hole 6, causes the vacuum rod 4 within the component fixing block 1 to ascend against the spring 5, whereby the top of the suction nozzle 3 is protruded from a top planar portion 1a of the component fixing block 1 to a constant extent. The electronic component 2 accommodated in a tray (not shown) for feeding electronic components is transferred to above the suction nozzle 3 within the component fixing block 1 by the transfer nozzle 9 of the component transfer shaft 10. When the electronic component 2 is placed at a suctional top surface 3b of the suction nozzle 3, the bottom surface of the electronic component 2 is drawn to the suction nozzle 3 with a negative pressure applied to the hole 7. Next, the pressures applied to the holes 6, 7 are shut off, so that the suction nozzle 3 is lowered by the biasing force of the spring 5. As a result, the suctional top surface 3b of the suction nozzle 3 descends to lower than the top planar portion 1a of the component fixing block 1.

Thereafter, the electronic component 2 is moved together with the component fixing block 1, while keeping placed on the component fixing block 1, to a suction-for-mounting position where the mounting head 11 can draw the component 2 thereto by suction. Then, images of the electronic component 2 are captured by a plurality of recognition cameras (not shown) arranged beside the suction-for-mounting position, in order that upper and lower bends of each lead terminal 2a of the electronic component 2 are detected. It is noted that while the component fixing block 1 is moved up to the suction-for-mounting position, the holding members 8 are moved to places close to the lead terminals 2a of the electronic component 2 placed on the component fixing block 1, so that the electronic component 2 is restricted in position so as to be brought into a proper posture for image picking-up.

Figure 3A:
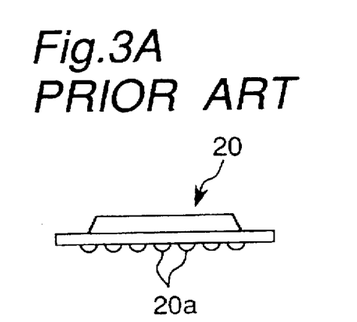
FIG. 3A is a side view of a BGA.
Figure 3B:
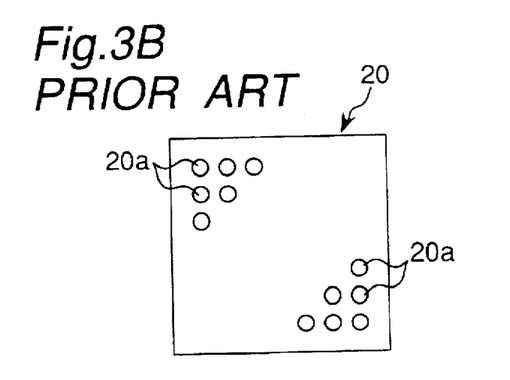
FIG. 3B is a bottom view of the BGA.

However, the electronic component transfer apparatus as shown in FIGS. 4A and 4B is so structured that the suction passage 3a of the suction nozzle 3 is closed by the lower surface of a body 2b of the electronic component 2 with a negative pressure applied to the hole 7, and then the vacuum rod 4 and the suction nozzle 3 are lowered. Therefore, in the case of transferring an electronic component 20 having pits and projections at its lower surface, such as a BGA (Ball Grid Array) as shown in FIGS. 3A and 3B, since the electronic component 20 has terminal portions 20a on its lower surface, the suction passage 3a of the suction nozzle 3 is kept open. Therefore, the vacuum rod 4 and the suction nozzle 3 will not descend together with the electronic component 20 such that the component 20 cannot be drawn and held in a stable posture.

SUMMARY OF THE INVENTION

An object of the present invention is therefore to provide an electronic component transfer apparatus and method both of which can successfully position an electronic component onto a component fixing block and transfer it to a specified place without difficulties, whether the electronic component is one that can be drawn by suction by its lower surface or another that has pits and projections at its lower surface so that it cannot be drawn by suction.

In accomplishing these and other aspects, according to one aspect of the present invention, there is provided an electronic component transfer apparatus comprising:

a suction nozzle, having a suctional top surface, for drawing an electronic component by suction to said suctional top surface of the suction nozzle;

a component fixing means which allows the suction nozzle to move in sliding contact therewith within a hole provided at an inside center of the component fixing means (or component fixing part), and which holds the suction nozzle movable up and down so that the suctional top surface of the suction nozzle is brought into a protruded posture at a top end position of a range of the sliding movement;

a transfer nozzle which is movable up and down and which serves to place the electronic component onto the suctional top surface of the suction nozzle in a state that the transfer nozzle has drawn the electronic component thereto by suction;

a biasing means (or biasing part) which is interposed between a member on the component fixing means side and a member on the suction nozzle side and which biases the suction nozzle upward relative to the component fixing means;

a suction nozzle fixing stopper for fixing the suction nozzle in its position relative to the component fixing means by being engaged with the suction nozzle side member;

a holding means (or holding part) for holding the electronic component in its position relative to the component fixing means by being engaged with the electronic component placed on the component fixing means; and a control means (or control part) for controlling so as to press the electronic component placed on the component fixing means from above with the transfer nozzle so that the electronic component is sandwiched between the transfer nozzle and the suction nozzle, to fix the position of the suction nozzle by the suction nozzle fixing stopper, and, in this state, to hold the electronic component on the component fixing means by the holding means.

According to another aspect of the present invention, there is provided an electronic component transfer method comprising:

a first step of placing an electronic component on a suctional top surface of a suction nozzle brought into a protruded posture relative to a component fixing means while the electronic component is drawn by suction by a transfer nozzle which is movable up and down;

a second step of pressing the electronic component placed on the component fixing means from above with the transfer nozzle so that the electronic component is sandwiched between the transfer nozzle and the suction nozzle;

a third step of fixing a position of the suction nozzle by the suction nozzle fixing stopper; and a fourth step of, in this state, holding the electronic component on the component fixing means by the holding means.

With the above arrangement, in a case where the electronic component has pits and projections at its lower surface so that it cannot be drawn by suction by the suction nozzle, the electronic component can be successfully, positioned onto the component fixing means and set to a specified place without difficulties.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Before the description of the present invention proceeds, it is to be noted that like parts are designated by like reference numerals throughout the accompanying drawings.

Now an embodiment of the present invention is described with reference to the accompanying drawings.

Figure 6:
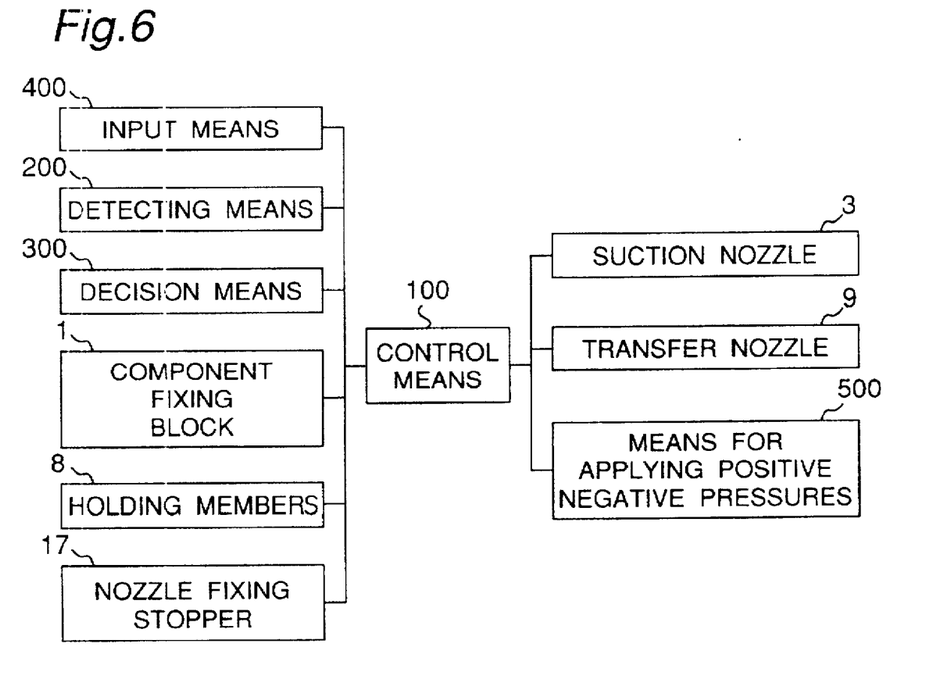
FIG. 6 is a block diagram showing a driving and control mechanism of the apparatus of FIG. 1.

An electronic component transfer apparatus according to an embodiment of the present invention has a construction shown in FIG. 6. In FIG. 6, a control means (or control part) 100 controls operations of a component fixing block 1 as one example of a component fixing means, holding members 8 as one example of holding means (or holding part), nozzle fixing stopper 17, suction nozzle 3, transfer nozzle 9, and a means (or part) 500 for applying positive and negative pressures. The control means 100 receives an input from an input means (or input part) 400 which is instructed by an operator or a data stored in a memory. The input includes information 8 of whether or not an electronic component 2, 20 can be drawn by suction by the suction nozzle 3, according to a configuration of a lower surface of the electronic component 2, 20.

When the electronic component 2 has a flat lower surface configuration so that it can be drawn thereto by the suction nozzle 3, the electronic component transfer apparatus of the present embodiment performs the same operation as an electronic component transfer apparatus in FIGS. 4A and 4B. That is, the electronic component transfer apparatus according to the embodiment of the present invention has functions similar to those of the electronic component transfer apparatus shown in FIGS. 4A and 4B.

Figure 2A:
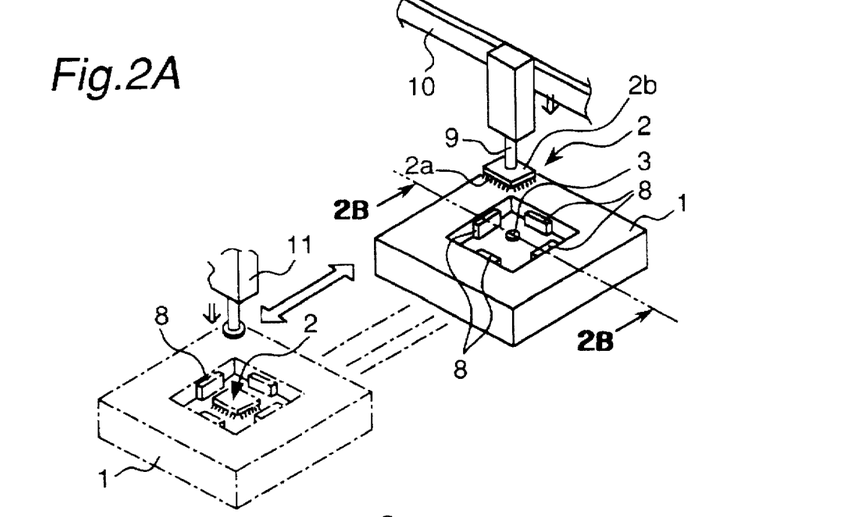
FIG. 2A is a perspective view of the electronic component transfer apparatus.
Figure 2B:
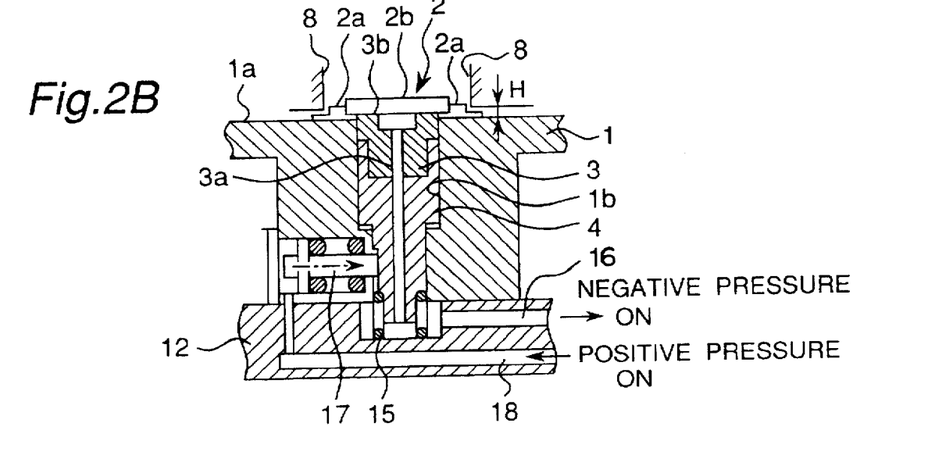
FIG. 2B is a sectional view of the electronic component transfer apparatus.
Figure 5:
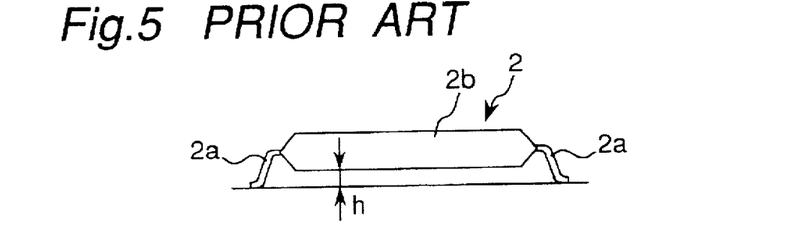
FIG. 5 is a side view of an electric component.

The electronic component transfer apparatus shown in FIGS. 2A and 2B has a function to solve a problem caused in the conventional apparatus of FIG. 5. That is, in the conventional apparatus of FIG. 5, the lower end surface of the lead terminal 2a of the electronic component 2, such as a QFP (Quad-Flat-Package), is located a distance h lower than the lower surface of a body 2b of the electronic component 2. Therefore, in the electronic component transfer apparatus as shown in FIGS. 4A and 4B, when the positive pressure applied to the hole 6 is shut off in the state that the electronic component 2 is placed on the suctional top surface 3b of the suction nozzle 3, the electronic component 2 and the suction nozzle 3 descend due to the biasing force of the spring 5, so that the lead terminal 2a of the electronic component 2 will come into contact with the top planar portion 1a of the component fixing block 1. As a result, the suction nozzle 3 is propelled to descend due to the biasing force of the spring 5 to a lower end position of the range over which the suction nozzle 3 can slide (ascend and descend) in contact with the component fixing block 1. This causes the electronic component 2 to be repelled up from the component fixing block 1 by the reaction force of the lead terminal 2a, such that the electronic component 2 could not be positioned accurately. Thus, there would be a possibility of inaccurate detection of the upper and lower bends of the lead terminal 2a of the electronic component 2.

The electronic component transfer apparatus shown in FIGS. 2A and 2B can solve this problem. Its component parts similar in function to those of the electronic component transfer apparatus shown in FIGS. 4A and 4B are designated by like numerals and their description is omitted.

That is, in this electronic component transfer apparatus of FIGS. 2A and 2B, a vacuum rod 4 and a suction nozzle 3 are biased upward by a spring 15 interposed between the vacuum rod 4 and a lower block 12. When a negative pressure is not applied through a hole 16 provided in the lower block 12, a suctional top surface 3b of the suction nozzle 3 is protruded from a top planar portion 1a of a component fixing block 1 to a constant extent. Also, by applying a negative pressure through the hole 16 of the lower block 12 in a state that an electronic component 2 is placed on the suctional top surface 3b of the suction nozzle 3, the electronic component 2 is drawn to suction to the suction nozzle 3. At the same time, the vacuum rod 4 and the suction nozzle 3 are lowered by the negative pressure until the lead terminals 2a of the electronic component 2 come into contact with the top planar portion 1a of the component fixing block 1.

In this case, the electronic component transfer apparatus of FIGS. 2A and 2B is provided with a nozzle fixing stopper 17 for fixing the vacuum rod 4 at a position of any height relative to the component fixing block 1. With this arrangement, when the lead terminals 2a of the electronic component 2 are brought into contact with the top planar portion 1a of the component fixing block 1, the nozzle fixing stopper 17 is protruded toward a side face of the vacuum rod 4 so that the vacuum rod 4 and the suction nozzle 3 are fixed. As a result, reaction force due to suction force of the suction nozzle 3 is no longer applied to the lead terminals 2a, whereby the electronic component 2 is prevented from being repelled up.

The nozzle fixing stopper 17 is driven by applying a positive pressure through a hole 18 provided in the lower block 12 or the like. Then, after the negative pressure applied to the hole 16 is cut off while the nozzle fixing stopper 17 is kept in contact with the vacuum rod 4, the upper and lower bends of the leads of the electronic component 2 are detected by recognition cameras. Further, in the same way as in the electronic component transfer apparatus shown in FIGS. 4A and 4B, when the component fixing block 1 is moved to the suction-for-mounting position, holding members 8 are moved to places close to the lead terminals 2a of the electronic component 2 placed on the component fixing block 1, so that the electronic component 2 is restricted in position so as to be brought into a proper posture for image pick-up.

However, the electronic component transfer apparatus as shown in FIGS. 2A and 2B is so structured that a suction passage 3a of the suction nozzle 3 is closed by the lower surface of a body 2b of the electronic component 2 with a negative pressure applied to the hole 16, whereby the vacuum rod 4 and the suction nozzle 3 are lowered. Therefore, in the case of transferring an electronic component 20 having pits and projections at its lower surface, such as a BGA (Ball Grid Array) as shown in FIGS. 3A and 3B, since the electronic component 20 has terminal portions 20a on its lower surface so that the suction passage 3a of the suction nozzle 3 is kept open, the vacuum rod 4 and the suction nozzle 3 will not descend such that the component cannot be drawn and held by suction in a stable posture.

The apparatus of the present embodiment can solve such a problem caused in the apparatus of FIGS. 2A and 2B. That is, when an electronic component 20 has pits and projections at its lower surface so that it cannot be drawn by suction by the suction nozzle 3, the electronic component transfer apparatus is operated by the control means 100 in the following manner.

Figure 1:
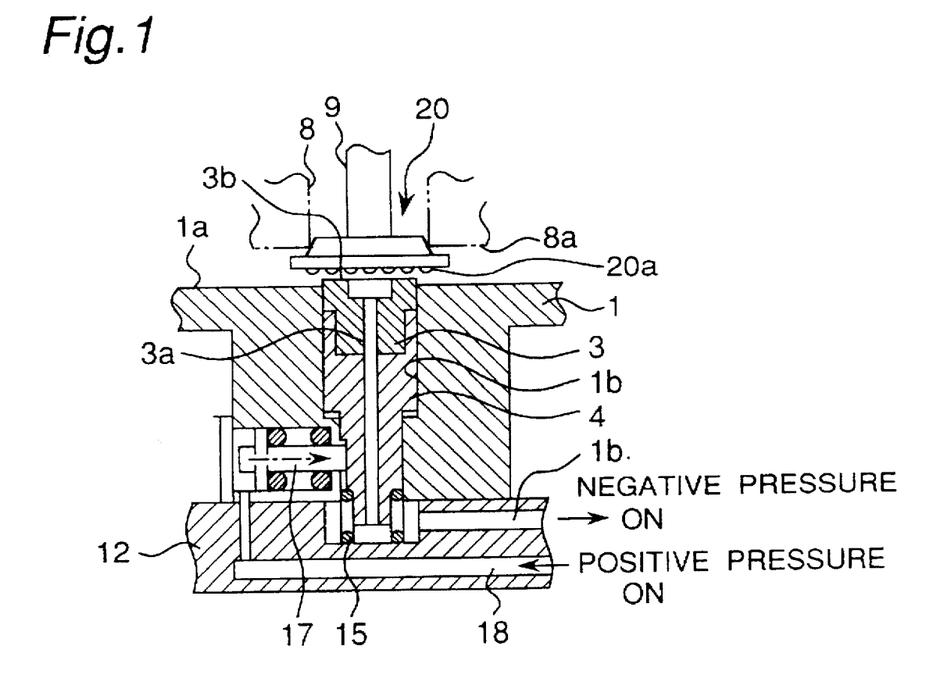
FIG. 1 is a sectional view of an electronic component transfer apparatus according to an embodiment of the present invention.
Figure 7:
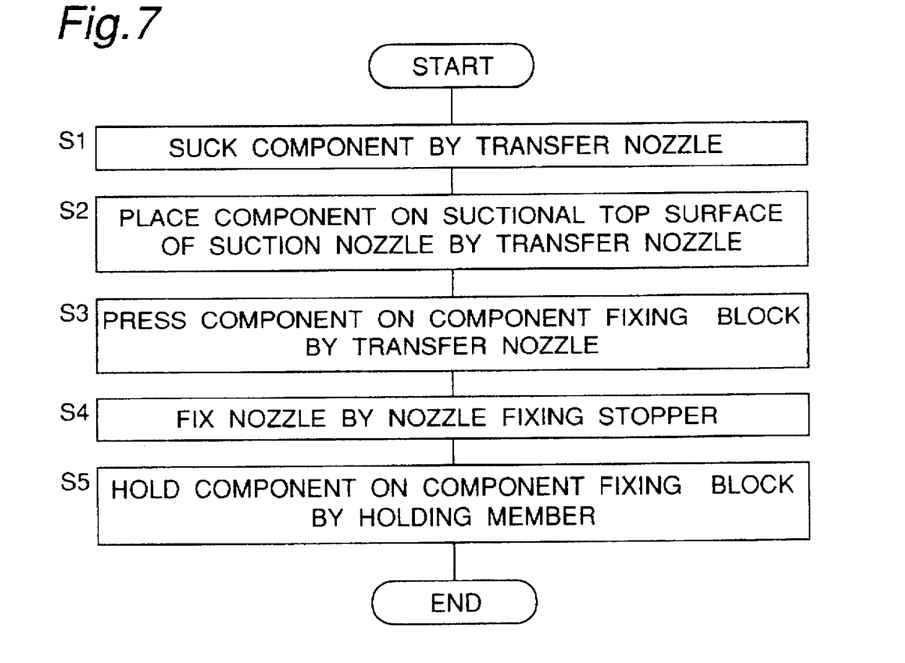
FIG. 7 is a flowchart showing one embodiment of an electronic component transfer method which is carried out by the apparatus of FIG. 1.

As shown in FIGS. 1 and 7, when the electronic component 20 having pits and projections at its lower surface, such as a BGA, is transferred, the control means 100 receives, through the input means 400, an input of information that the electronic component 20 has pits and projections at its lower surface so that the electronic component 20 cannot be drawn by suction by the suction nozzle 3. Then, in a state that the electronic component 20 drawn by suction the transfer nozzle 9 at step S1 of FIG. 7 is placed by the transfer nozzle 9 on the suction nozzle 3 protruded from the component fixing block 1 to a constant extent at step S2, the electronic component 20 is further pressed from above by the transfer nozzle 9 at step S3 so as to be sandwiched between the transfer nozzle 9 and the suction nozzle 3. Thereafter, a positive pressure is applied through a hole 18 of a lower block 12 of the component fixing block 1 by the pressure applying means (or pressure applying part) 500, whereby a vacuum rod 4 and the suction nozzle 3 are fixed in position by the nozzle fixing stopper 17 at step S4. Then, for the process of moving the component fixing block 1 to a suction-for-mounting position, the holding members 8 are previously moved toward the center of the component fixing block 1 so as to be brought into contact with side surfaces of the electronic component 20, whereby the electronic component 20 is held by the holding members 8 at step S5. Subsequently, the transfer nozzle 9 is elevated, and the component fixing block 1 is moved to the suction-for-mounting position while the electronic component 20 is held in posture by the component fixing block 1, the suction nozzle 3, and the holding members 8, whereby the electronic component 20 is transferred.

In this way, according to the electronic component transfer apparatus, in either case where the electronic component 2, 20 has a flat lower surface configuration, or where it has a lower surface configuration having pits and projections, the electronic component 2, 20 can be successfully positioned and held on the component fixing block 1 so that the electronic component 2, 20 can be transferred to a specified place such as a suction-for-mounting position without difficulties.

Although in the embodiment, the control means 100 receives the input from the input means 400 before the first step S1, the control means 100 can receive the input from the input means 400 after the first step S1 and before the second step S2.

Although the apparatus can be applied to both cases where the electronic component 2, 20 can be drawn by suction and can not be drawn by suction by the suction nozzle 3, the apparatus can be applied to only one case where the electronic component 20 can not be drawn by suction by the suction nozzle 3.

Figure 8:
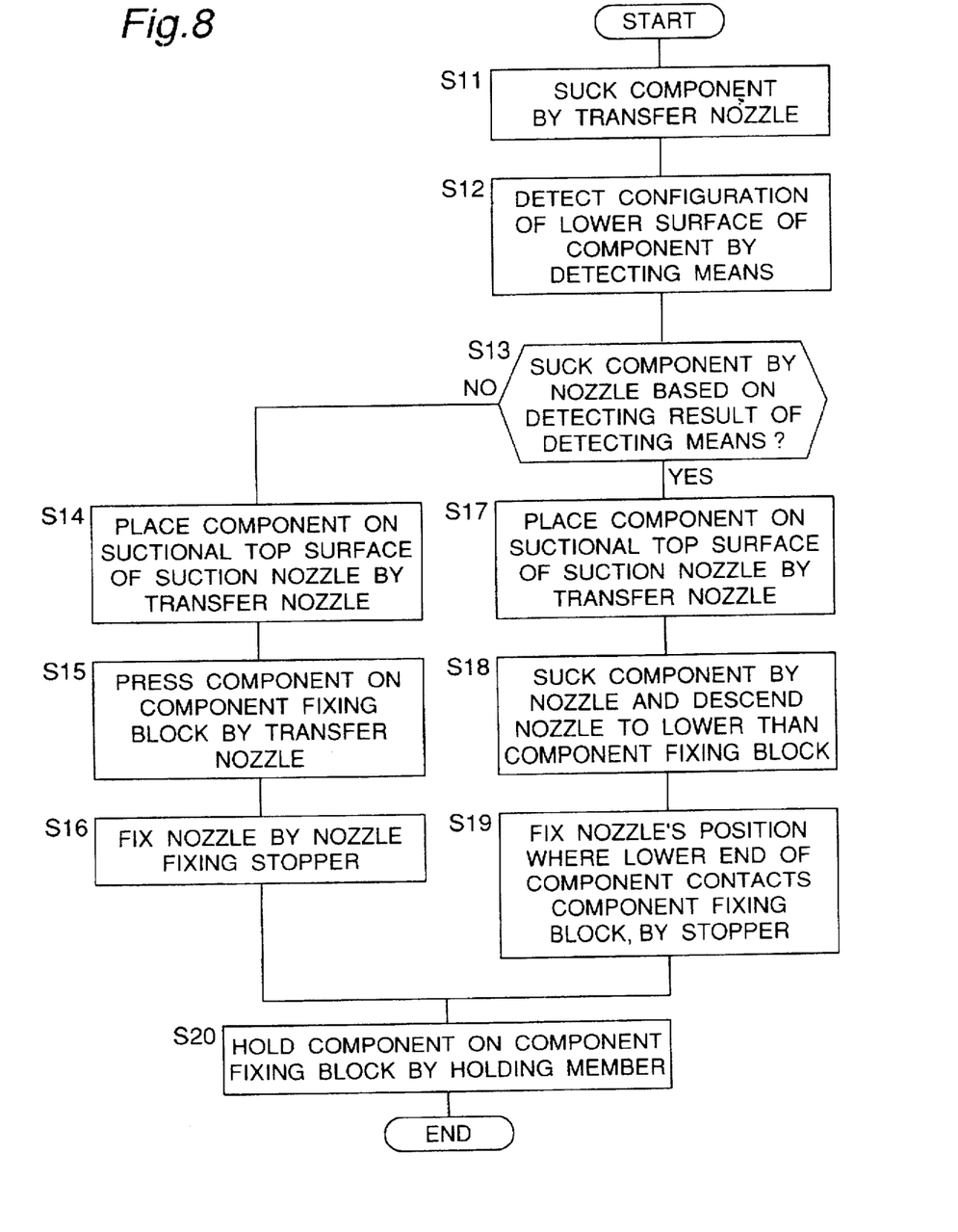
FIG. 8 is a flowchart showing another embodiment of an electronic component transfer method which is carried out by the apparatus of FIG. 1.

In the above-described embodiment, the control means 100 has been arranged to directly receive an input of information of whether or not the electronic component 2, 20 can be drawn by suction by the suction nozzle 3 through the input means 400. However, the arrangement is not limited to this. For example, as shown in FIGS. 6 and 8, a detecting means (or detecting part) 200 for detecting the configuration of the lower surface of the electronic component 2, 20 and a decision means (or decision part) 300 for deciding whether or not the electronic component 2, 20 can be drawn by suction by the suction nozzle 3 based on a detected configuration of the lower surface of the electronic component 2, 20 by the detecting means 200 may be provided. Thus, whether or not the electronic component 2, 20 can be drawn by suction by the suction nozzle 3 is decided by the decision means 300 based on the information from the detecting means 200, and the manner in which the electronic component 2, 20 is held is determined according to the decision result.

That is, firstly, the electronic component 2, 20 is drawn by suction by the transfer nozzle 9 at step S11 of FIG. 8, and then a configuration of a lower surface of the electronic component 2, 20 is detected by the detecting means 200 such as a recognizing camera for recognizing the configuration of the lower surface of the electronic component 2, 20 at step S12. Then, the decision means 300 decides whether or not the electronic component 2, 20 can be drawn by suction by the suction nozzle 3 based on a detected configuration of the lower surface of the electronic component 2, 20 by the detecting means 200 at step S13.

When the decision means 300 decides that the electronic component 2 can be drawn by suction by the suction nozzle 3, under control of the control means 100, the electronic component 2 is placed on the component fixing block 1 at step S17, the electronic component 2 placed on the component fixing block 1 is drawn by suction by the suction nozzle 3 at step S18, the suction nozzle 3 is lowered relative to the component fixing block 1, the suction nozzle fixing stopper 17 is activated at a position where a lower end portion of the electronic component 2 comes into contact with the component fixing block 1 so that the suction nozzle 3 is fixed in position relative to the component fixing block 1 at step S19, and in this state, the electronic component 2 is held on the component fixing block 1 by the holding members 8 at step S20.

On the other hand, when the decision means 300 decides that the electronic component 20 can not be drawn by suction by the suction nozzle 3, under control of the control means 100, the electronic component 20 is placed on the component fixing block 1 at step S14, the electronic component 20 placed on the component fixing block 1 is pressed from above with the transfer nozzle 9 so that the electronic component 20 is sandwiched between the transfer nozzle 9 and the suction nozzle 3 at step S15, the position of the suction nozzle 3 is fixed by the suction nozzle fixing stopper 17 at step S16, and, in this state, the electronic component 20 is held on the component fixing block 1 by the holding members 8 at step S20.

As seen above, according to the present invention, the electronic component transfer apparatus is controlled by a control means in the following manner. That is, the information of whether or not the electronic component can be drawn by suction by the suction nozzle is determined or inputted according to the configuration of the lower surface of the electronic component. As a result, when the electronic component can be drawn by suction by the suction nozzle, the electronic component placed on the component fixing means is drawn by suction by the suction nozzle. Then, the suction nozzle is lowered with respect to the component fixing means, and the suction nozzle fixing stopper is activated at a position where the lower end portion of the electronic component comes into contact with the component fixing means, so that the suction nozzle is fixed in position with respect to the component fixing means. In this state, the electronic component is held on the component fixing means by the holding members. On the other hand, when the electronic component cannot be drawn by suction by the suction nozzle, the electronic component placed on the component fixing means is pressed from above by the transfer nozzle so as to be sandwiched between the transfer nozzle and the suction nozzle, so that the suction nozzle is fixed in position by the suction nozzle fixing stopper. In this state, the electronic component is held on the component fixing means by the holding members. Over such control operations, in either case where the electronic component has a flat lower surface configuration so that it can be drawn by suction by the suction nozzle or where it has a lower surface having pits and projections so that it cannot be drawn by suction by the suction nozzle, the electronic component can be successfully positioned on the component fixing means and set to a specified place without difficulties.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An electronic component transfer apparatus comprising:

a suction nozzle, having a suctional top surface, for drawing an electronic component by suction to said suctional top surface;

a component fixing part having a hole provided at an inside center thereof within which said suction nozzle is movable in sliding contact with the component fixing part, such that the suction nozzle is movable up and down so that the suctional top surface of the suction nozzle is brought into a protruded posture at a top end position of a range of the sliding movement;

a transfer nozzle which is movable up and down and which serves to place the electronic component onto the suctional top surface of the suction nozzle in a state that the transfer nozzle has drawn the electronic component thereto by suction;

a biasing part which is interposed between the component fixing part and the suction nozzle and which biases the suction nozzle upward relative to the component fixing part;

a suction nozzle fixing stopper for fixing the suction nozzle in its position relative to the component fixing part by operatively engaging the suction nozzle;

a holding means for holding the electronic component in its position relative to the component fixing part by being engaged with the electronic component placed on the component fixing part; and a control means for controlling so as to press the electronic component placed on the component fixing part from above with the transfer nozzle so that the electronic component is sandwiched between the transfer nozzle and the suction nozzle, to fix the position of the suction nozzle by the suction nozzle fixing stopper, and, in this state, to hold the electronic component on the component fixing part by the holding means.

2. The electronic component transfer apparatus as claimed in claim 1, further comprising:

an input means for inputting into the control means information of whether or not the electronic component can be drawn by suction by the suction nozzle, according to a configuration of a lower surface of the electronic component, wherein when the electronic component can be drawn by suction by the suction nozzle based on an input of the input means into the control means, under control of the control means, the electronic component placed on the component fixing part is drawn by suction by the suction nozzle, the suction nozzle is lowered relative to the component fixing part, the suction nozzle fixing stopper is activated at a position where a lower end portion of the electronic component comes into contact with the component fixing part so that the suction nozzle is fixed in position relative to the component fixing part, and in this state, the electronic component is held on the component fixing part by the holding means, and when the electronic component can not be drawn by suction by the suction nozzle based on an input of the input means into the control means, under control of the control means, the electronic component placed on the component fixing part is pressed from above with the transfer nozzle so that the electronic component is sandwiched between the transfer nozzle and the suction nozzle, the position of the suction nozzle is fixed by the suction nozzle fixing stopper, and, in this state, the electronic component is held on the component fixing part by the holding means.

3. The electronic component transfer apparatus as claimed in claim 1, further comprising:
   a detecting means for detecting the configuration of the lower surface of the electronic component; and
   a decision means for deciding whether or not the electronic component can be drawn by suction by the suction nozzle based on a detected configuration of the lower surface of the electronic component by the detecting means,
   wherein when the decision means decides that the electronic component can be drawn by suction by the suction nozzle, under control of the control means, the electronic component placed on the component fixing part is drawn by suction by the suction nozzle, the suction nozzle is lowered relative to the component fixing part, the suction nozzle fixing stopper is activated at a position when a lower end portion of the electronic component comes into contact with the component fixing part so that the suction nozzle is fixed in position relative to the component fixing part, and in this state, the electronic component is held on the component fixing part by the holding means, and
   when the decision means decides that the electronic component can not be drawn by suction by the suction nozzle under the control of the control means, the electronic component placed on the component fixing part is pressed from above with the transfer nozzle so that the electronic component is sandwiched between the transfer nozzle and the suction nozzle, the position of the suction nozzle is fixed by the suction nozzle fixing stopper, and, in this state, the electronic component is held on the component fixing part by the holding means.

4. An electronic component transfer method comprising:
   placing an electronic component on a suctional top surface of a suction nozzle brought into a protruded posture relative to a component fixing part while the electronic component is drawn by suction by a transfer nozzle which is movable up and down;
   pressing the electronic component placed on the component fixing part from above with the transfer nozzle so that the electronic component is sandwiched between the transfer nozzle and the suction nozzle;
   fixing a position of the suction nozzle by a suction nozzle fixing stopper; and
   in this state, holding the electronic component on the component fixing part by a holding part.

5. The electronic component transfer method as claimed in claim 4, wherein, before said pressing of said electronic component is performed, said fixing of the position of said suction nozzle is performed, and said holding of the electronic component on the component fixing part is performed, information is obtained as to whether or not the electronic component can be drawn by suction by the suction nozzle, according to a configuration of a lower surface of the electronic component, and further comprising:
   drawing, by suction of the suction nozzle, the electronic component placed on the component fixing part;
   lowering the suction nozzle relative to the component fixing part;
   activating the suction nozzle fixing stopper at a position where a lower end portion of the electronic component comes into contact with the component fixing part so that the suction nozzle is fixed in position relative to the component fixing part; and
   in this state, holding the electronic component on the component fixing part by the holding means,
   wherein when the electronic component can be drawn by suction by the suction nozzle based on the obtained information, said placing of the electronic component is performed, said drawing of the electronic component placed on the component fixing part is performed, said lowering of the suction nozzle is performed, said activating of the suction nozzle fixing stopper is performed and said holding of the electronic component on the component fixing part is performed, and
   when the electronic component can not be drawn by suction by the suction nozzle based on the obtained information, said placing of the electronic component is performed, said pressing of the electronic component is performed, said fixing of the position of the suction nozzle is performed and said holding of the electronic component on the component fixing part is performed.

6. The electronic component transfer method as claimed in claim 4, wherein, before said pressing of the electronic component is performed, said fixing of the position of the suction nozzle is performed and said holding of the electronic component on the component fixing part is performed:
   detecting the configuration of the lower surface of the electronic component by a detecting part; and
   deciding whether or not the electronic component can be drawn by suction by the suction nozzle, by a decision part, based on a detected configuration of the lower surface of the electronic component, and further comprising:
   drawing, by suction of the suction nozzle, the electronic component placed on the component fixing part;
   lowering the suction nozzle relative to the component fixing part;
   activating the suction nozzle fixing stopper at a position where a lower end portion of the electronic component comes into contact with the component fixing part so that the suction nozzle is fixed in position relative to the component fixing part; and
   in this state, holding the electronic component on the component fixing part by the holding means,
   wherein when the decision part decides that the electronic component can be drawn by suction by the suction nozzle, said drawing of the electronic component placed on the component fixing part is performed, said lowering of the suction nozzle is performed, said activating of the suction nozzle fixing stopper is performed and said holding of the electronic component on the component fixing part is performed, and
   when the decision part decides that the electronic component can not be drawn by suction by the suction nozzle, said placing of the electronic component is performed, said pressing of the electronic component is performed, said fixing of the position of the suction nozzle is performed and said holding of the electronic on the component fixing part is performed.

* * * * *